(12) United States Patent
Oberleitner

(10) Patent No.: US 8,648,367 B2
(45) Date of Patent: Feb. 11, 2014

(54) LED COMPRISING A MULTIBAND PHOSPHOR SYSTEM

(75) Inventor: Wolfgang Oberleitner, Vienna (AT)

(73) Assignee: Ledon Lighting Jeennersdorf GmbH, Jennersdorf (AT)

( * ) Notice: Subject to any disclaimer, the term of this patent is extended or adjusted under 35 U.S.C. 154(b) by 70 days.

(21) Appl. No.: 12/990,477

(22) PCT Filed: Apr. 29, 2009

(86) PCT No.: PCT/EP2009/003104
§ 371 (c)(1),
(2), (4) Date: Nov. 24, 2010

(87) PCT Pub. No.: WO2009/132834
PCT Pub. Date: Nov. 5, 2009

(65) Prior Publication Data
US 2011/0057227 A1    Mar. 10, 2011

(30) Foreign Application Priority Data
Apr. 30, 2008  (DE) .......................... 10 2008 021 662

(51) Int. Cl.
*H01L 33/00*    (2010.01)

(52) U.S. Cl.
USPC ................................... 257/98; 257/E33.061

(58) Field of Classification Search
USPC ........................................... 257/98, E33.061
See application file for complete search history.

(56) References Cited

U.S. PATENT DOCUMENTS

| | | | |
|---|---|---|---|
| 6,255,670 B1 * | 7/2001 | Srivastava et al. | 257/89 |
| 6,943,380 B2 | 9/2005 | Ota et al. | |
| 7,804,237 B2 | 9/2010 | Braune et al. | |
| 2007/0031685 A1 * | 2/2007 | Ko et al. | 428/447 |
| 2008/0088226 A1 * | 4/2008 | Sohn et al. | 313/503 |
| 2010/0045163 A1 | 2/2010 | Winkler et al. | |

FOREIGN PATENT DOCUMENTS

| | | |
|---|---|---|
| EP | 1560274 A1 | 8/2005 |
| EP | 1670070 A1 | 6/2006 |
| WO | WO-02054502 A1 | 7/2002 |
| WO | WO-2006114077 A2 | 11/2006 |
| WO | WO-2007060573 A1 | 5/2007 |

OTHER PUBLICATIONS

International Search Report for PCT/EP2009/003104 dated Nov. 20, 2009.

* cited by examiner

*Primary Examiner* — Robert Huber
(74) *Attorney, Agent, or Firm* — Marshall, Gerstein & Borun LLP

(57) ABSTRACT

An LED module comprising at least one blue LED and a color conversion layer that is applied thereto and emits a mixed light of the blue light of the LED and the converted spectrum of the color conversion layer. The color conversion layer has at least three different phosphors which at least partially convert the light of the blue LED into red, green, and yellow or yellowish-green light. The phosphor for conversion into red light is a doped nitride compound, preferably a nitrido-silicate.

12 Claims, 7 Drawing Sheets

LED COMPRISING A MULTIBAND PHOSPHOR SYSTEM

FIELD OF THE INVENTION

The present invention relates to a light-emitting diode ("LED") comprising a multiband phosphor system which converts the light emitted by the blue or UV LED at least partially into a red, yellow and green spectrum and emits a mixed light comprising the red, yellow and green and the spectrum of the LED. However, in the case of a UV LED, the emission of unconverted light is undesirable since UV radiation can damage the eyes.

BACKGROUND OF THE INVENTION

It is known from the prior art to apply a phosphor to an existing LED in order to convert the light spectrum emitted by the LED at least partially into another light spectrum. In this case, the radiation emitted by the LED is absorbed at least partially by the phosphor, which is therefore excited to produce photoluminescence. The resulting emission or light color of the LED module or the light source is then produced from the mixture of the transmitted (i.e. unconverted) portion of the spectrum of the LED and the emission spectrum of the phosphor.

In order to produce white light, in this case an LED which emits blue light and therefore light of a wavelength of approximately 440-480 nm is preferably used. The phosphor used is, for example, doped YAG (yttrium aluminum garnet), which, depending on the concentration, absorbs parts of the blue light emitted by the LED and converts it into predominantly yellow luminescence radiation with a high degree of efficiency. In addition, the phosphor used can be a mixture of green and red phosphor which converts the blue light of the LED at least partially into green and red luminescence radiation. Owing to the resultant additive color mixing of the colors blue, red and green, white light can therefore be produced.

In addition, it is possible to apply a three-band phosphor system to the blue LED. In this case, three different phosphors are applied to the LED which convert the emitted light of the LED into green, red and yellow luminescence radiation.

In the above-described phosphor systems, it is particularly desirable to achieve a high color rendering value (CIE Color Rendering Index (CRI)) of the LED to be produced. This is understood to be a photometric variable, which can be used to describe the quality of the color rendering of light sources of identical correlated color temperature. Depending on how many of the in total 16 standard colors are used for the calculation of the color rendering value, different color rendering values are defined, with the most common being RA8 and RA14. Spectral portions outside the visible range are irrelevant in the determination of the color rendering value.

DE 10 2006 016 548 A1 describes a phosphor which emits blue to yellow and which consists of a nitride orthosilicate and is intended to make it possible to produce color-stable, efficient LEDs with good color rendering. In addition, the phosphor is very stable to radiation, which means that it can be used in high-brightness LEDs.

In this case, a phosphor mixture with in particular three phosphors is provided in order to provide warm-white LEDs with a high color rendering index Ra of up to 97. In addition to the novel green-yellow phosphor, a red, in particular nitride phosphor is added.

DE 10 2007 001 903 A1 describes a phosphor body containing Cr(III)-activated aluminum oxide (ruby), the production thereof and the use thereof as LED conversion phosphor for white LEDs or so-called color-on-demand applications being envisaged.

The red phosphor used can be nitridosilicate. In addition, the use of a Ce-doped YAG phosphor is disclosed.

The phosphor body is preferably used for the purpose of implementing stable color loci for color-on-demand LED applications with red light portions. Accordingly, a preset color value is achieved by corresponding mixing of the ruby-containing phosphor body with a further conversion phosphor, with the deep-red emission resulting in superior color rendering.

Single-component and two-component phosphor systems have the disadvantage in comparison with three-component phosphor systems that, at a constant color temperature, at a constant wavelength and at a constant power of the LED chips and with an absolutely identical LED package, apart from random fluctuations, it is only possible to achieve one color rendering value and one luminous flux. Precise setting of the color rendering value is therefore not possible with single-component and two-component phosphor systems.

The three-band phosphor systems known from the prior art have the disadvantage that the luminous efficacy is reduced at the same time as the color rendering value of the LED increases. In order to achieve a luminous efficacy which is as high as possible for an LED module, the color rendering value should therefore not be above predefined requirements in order to avoid the disadvantage associated with the luminous efficacy. Precise setting of the color rendering value is therefore desirable.

One problem in particular with the multiband phosphor systems is also the fact that the light conversion by the phosphors depends on the temperature in the color conversion layer in which the phosphors are located. In addition, the current flowing through the LED has a decisive influence on the light conversion within the color conversion layer. In the known multiband phosphor systems, a certain decrease in the performance of the color conversion at relatively high temperatures and/or relatively high currents through the LED tends to take place (quenching or saturation effects). As a result of this decrease in the phosphor efficiency, the color locus of the emitted light of the LED module shifts, this color locus being expressed by x and y coordinates in the CIE chromaticity diagram.

The invention therefore provides a three-band phosphor system which is stable with respect to the temperature and the current flow through the LED for an LED module, which three-band phosphor system enables a luminous efficacy which is as high as possible given a predefined color rendering value of the LED module.

OBJECT AND SUMMARY OF THE INVENTION

The invention concerns an LED module having at least one blue LED and a color conversion layer applied thereto, which color conversion layer emits a mixed light comprising the blue light of the LED and the converted spectrum of the color conversion layer, wherein the color conversion layer has at least three different phosphors, which convert the light of the blue LED at least partially into red, green and yellow or yellow-green light, and wherein the phosphor for conversion into red light is a doped nitride compound, preferably a nitridosilicate.

As a result of the color conversion layer according to the invention, accordingly, the blue light emitted by the LED is converted at least partially into red, green and yellow light, as a result of which a white light is emitted by the LED module owing to the additive color mixing.

The color conversion layer is applied to the LED according to the invention in such a way that the entire light-emitting surface of the LED is covered by the color conversion layer. Accordingly, the total light which is emitted by the LED is preferably transmitted by the color conversion layer.

The color conversion layer preferably consists of an optically transparent material, which contains phosphor particles as the phosphor. According to the invention, the color conversion layer comprises at least three different types of phosphor, including at least one phosphor which converts the light emitted by the LED into red light. This phosphor is preferably a nitride compound, for example a doped nitridosilicate, as is known as such, for example, from WO 2006/114077.

In addition, the color conversion layer contains a phosphor which converts the light emitted by the LED into green light. This is preferably an alkaline earth metal orthosilicate doped with europium. The alkaline earth metals used can be Ba, Sr, Ca or mixtures of these elements. A europium-doped barium orthosilicate ("BOSE") is known from WO 2002/054502 A1.

Furthermore, the color conversion layer contains a phosphor which converts the light emitted by the LED into yellow light. This is preferably a doped YAG. In the three-band phosphor system according to the invention, it is possible to maximize the luminous flux by means of the doped YAG phosphor.

The abovementioned phosphors are already known from the prior art, but these sometimes have considerable disadvantages. For example, the YAG phosphor has a low color rendering value of approximately 65 to 75, depending on the most similar color temperature to be reached. A BOSE phosphor also has the disadvantage that the color locus is dependent on the temperature in the color conversion layer and the ambient temperature. In addition, the current flow through the LED has an influence on the color locus. This negative influence is very pronounced particularly in the case of yellow and orange BOSE phosphor.

In addition, a combination of green and red phosphor is known from the prior art, as a result of which a high color rendering value can be reached. Owing to the low sensitivity of the human eye to the color red, the use of the combination of green and red phosphor results in a substantially reduced luminous flux, however. In addition, the green phosphor sometimes has poor excitation as a result of blue LEDs, as a result of which the luminous efficacy is additionally reduced.

The three-band phosphor system according to the invention makes it possible to convert the blue light emitted by the LED, with it being possible to eliminate the abovementioned disadvantages by virtue of the mixing ratio according to the invention of the three-band phosphor system.

The percentage proportions of the individual phosphors in the multiband phosphor system according to the invention within the color conversion layer are preferably as follows:
green alkaline earth orthosilicate phosphor: 10-50%
red nitride phosphor: 10-30%
yellow YAG phosphor: 20-80%.

In this case, the green phosphor has a preferred main wavelength of from 520 to 530 nm. The main wavelength of the red phosphor is preferably between 630 and 650 nm and that of the yellow phosphor is preferably between 555 and 570 nm.

As a result of the abovementioned selection of the mixing ratio for the phosphors in the color conversion layer, a luminous efficacy of the module which is as high as possible can be achieved with a predetermined color rendering value for the LED module.

TABLE 1

Luminous flux values and color rendering values for different compositions of the three-band phosphor system according to the invention

| Luminous flux | RA8 | Ratio of YAG/BOSE/nitride |
|---|---|---|
| 30.8 | 95.2 | 30.0/50.5/19.5 |
| 32.6 | 92.1 | 41.0/40.0/19.0 |

Measured values for the luminous flux which can be achieved by the likewise specified mixing ratios of the three-band phosphor system according to the invention are given in table 1. In addition, the respective color rendering value (RA8) is given.

The basis for the given luminous flux values is formed by the measurement of in each case 20 LEDs with the same chip power (240-260 mW) and chip wavelength (462.5-465 nm). In this case, the color locus is at $x=0.409\pm0.010$, $y=0.394\pm0.010$ in the CIE chromaticity diagram. The ±values are in this case not standard deviations, but absolute limits.

As illustrated in table 1, as the YAG proportion increases to the detriment of the BOSE proportion, the luminous flux is increased by approximately 6%, while the color rendering value (RA8) is reduced by approximately 3 units.

In LED modules in which a color rendering value of RA8=90 is required, but 93 is reached as a result of the use of a binary phosphor system, several percentage points of light are therefore lost as a result of an excessively high color rendering value. This loss is increased up to 10% especially when using alternative and less efficient green phosphors which are not BOSE phosphors.

In contrast with a binary phosphor system, the three-band phosphor system according to the invention has the advantage that the color rendering value can be set freely within wide ranges. The color rendering value can be set freely in particular between the color rendering value which is achieved with pure YAG phosphor, i.e. without any nitride and BOSE admixtures, for example 75 at 5700 K, and that which is achieved with the binary BOSE nitride mixture, up to just 100 at 4000 K. By setting the color rendering value, it is possible for said value to be matched to a predefined color rendering value. A reduction in the color rendering value in this case results in an increase in the luminous flux. Precise setting of the color rendering value to a predefined value therefore has the advantage that there are no lumen losses as a result of an "excessively high" color rendering value.

The above-described setting or adapting of the LED module with respect to a predefined color rendering value is possible with the aid of statistical experiment planning (DOE). This makes it possible in particular to finely set the color rendering value and optimize the phosphor component ratio of the three-band phosphor system according to the invention. Accordingly, a luminous efficacy which is as high as possible for the LED module can be achieved given a predetermined color rendering value.

For this purpose, it is possible to use a method for finely setting the color rendering value and for optimizing the phosphor component ratio of a three-band phosphor system of an LED module.

In this case, in a first step, the parameters to be optimized, in particular the concentrations of the three phosphor components $c(A)$, $c(B)$, $c(C)$, and the so-called "response" variables, which are intended to be maximized or minimized, for example the luminous flux and the color rendering value, are defined.

In a second step, the necessary number of experiments with the respective parameter values to be used therein is calculated.

In a third step, the specified number of experiments with the respective parameter values specified for this purpose are performed.

Finally, in a fourth step, the optimum parameter values are calculated using the values determined from the experiments for the "response" variables.

In this case, steps 2 to 4 can be repeated as often as desired.

In addition, final fine setting of the phosphor composition can be performed.

Statistical experiment planning, i.e. a "design of experiments", is preferably used in the method.

In addition, in the first step, a design of experiments, for example a factorial design of experiments, can be fixed.

Preferably, in order to implement the method, a computer program is used, in particular for the second and fourth steps.

If only one or two color temperatures are required, on the other hand, an alternative method can be used to achieve the object more quickly.

This method again serves the purpose of finely setting the color rendering value and optimizing the phosphor component ratio of a three-band phosphor system of an LED module which has at least one blue or UV LED and, applied thereto, a color conversion layer with the three-band phosphor system.

In this case, in a first step, only a two-band phosphor system is used, for example yellow and red, which has a color rendering value which is too low.

Then, in a second step, parts of a phosphor component of the two-band phosphor system, for example the yellow phosphor, are replaced stepwise by a new phosphor component, for example green phosphor, until the specified color rendering value is reached.

Further preferably, in the second step, that phosphor component of the two-band phosphor system which is not replaced, is increased for the purpose of keeping the color locus constant. The phosphor may be the red phosphor, for example.

Preferably, the method is implemented with manual iteration, without using statistical experiment planning.

A further advantage according to the invention is that the three-band phosphor system according to the invention has very good stability at high temperatures in the color conversion layer and/or at high current intensities through the LED.

The phosphor mixture according to the invention has a particularly high color stability preferably at color intensities of up to 1000 mA and high color rendering values. This is particularly advantageous in the case of warm-white LEDs with a high color rendering value which often have a low stability of the phosphor system at currents above 500 mA owing to the high phosphor concentration, as a result of which quenching effects occur. The reason for this is that the proportion of converted light in the emitted LED spectrum is greater, the lower the color temperature and the higher the color rendering value. The higher the proportion of converted light, the greater the development of heat in the color conversion layer of the LED owing to the energy difference between the exciting and emitting radiation and the greater the probability of quenching effects (for example radiation-less transitions) and therefore a decrease in the performance of the phosphor.

The stability of the three-band phosphor system according to the invention therefore makes it possible, inter alia, to operate warm-white LEDs with high color rendering values at high currents (typically CCT<4500 K and RA8≥80).

It should be noted that in this case the entirety of the phosphor system, and not the individual components, needs to be taken into consideration since different properties of individual components in the phosphor system can bring about an increase or a decrease in an effect.

The phosphor mixture according to the invention also has particularly high color stability preferably at temperatures of between 25 and 85° C. The cited temperatures relate to the respective ambient temperature. In order to ensure this stability in the cited temperature range, a minimum degree of heat dissipation from the barrier layer of the LED chip is required. The thermal resistance of the barrier layer of the LED chip with respect to the surrounding environment should therefore not be greater than 50 K/W.

A further advantage of the present invention consists in that the phosphor mixture according to the invention has high stability even at high humidities.

The LED module according to the invention preferably has a color rendering value of between 80 and 95.

It is possible in a variety of ways to implement the LED module according to the invention by mechanical means. In accordance with a first preferred embodiment, provision is made for one or more LED chips to be arranged on a substrate within a reflector and for the phosphor to be dispersed in a prefabricated film, which is arranged over the LED chips.

However, it is also possible for one or more LED chips to be arranged on a printed circuit board within a reflector and for the phosphor to be applied to the reflector.

Preferably, the LED chips are cast with a transparent casting compound, which has a dome-like shape. This casting compound firstly forms mechanical protection and secondly also improves the optical properties of the LED module. Thus, for example, the light exit from the LED chip is improved. In addition, the LED chip can be arranged in a cutout in a printed circuit board, which cutout is filled with the aid of casting compound. The casting compound preferably comprises transparent silicone.

In a further preferred embodiment, the phosphor is dispersed in a casting compound which covers an arrangement of LED chips on a printed circuit board, if possible without any gas inclusions. In this case, the casting compound preferably completely encloses the LED chip such that the entire surface thereof is covered by the casting compound. In addition, it is possible for the LED chip to be enclosed by a transparent casting compound, which does not contain any phosphors, and for a further casting compound with phosphors contained to be arranged on the transparent casting compound. By virtue of similar refractive indices of the casting compounds, it is possible for the reflection at the interfaces to be reduced to a minimum.

An LED module according to the invention is configured such that, given a test time of t=0 to t=1000 hours, the chromaticity coordinates of the CIE chromaticity diagram of the light emitted by the LED module at 85° C. and 85% relative humidity have a maximum deviation of ±0.05%.

At a test time of t=0 to t=1000 hours, the relative luminous flux of the light emitted by the LED module at 85° C. and 85% relative humidity has a maximum deviation of 5%.

In this case, a current of I=0 or I=700 mA can be applied to the LED module in each case.

A change in the current flow through the LED module in the range of from 100 to 700 mA in this case causes a change in the color locus of the light emitted by the LED module, which is described by chromaticity coordinates of the CIE chromaticity diagram of less than 30% of the longitudinal axis of a MacAdam6 ellipse.

A change in the ambient temperature of the LED module in the range of from 25 to 85° C. in this case brings about a change in the color locus of the light emitted by the LED module, which is described by chromaticity coordinates of the CIE chromaticity diagram, of at most a fifth of the longitudinal axis of a MacAdam6 ellipse.

BRIEF DESCRIPTION OF THE DRAWINGS

A preferred exemplary embodiment of the LED module according to the invention is illustrated in the drawings and will be explained in more detail in the description below.

PRECISE DESCRIPTION OF THE EMBODIMENTS

Figure 1:
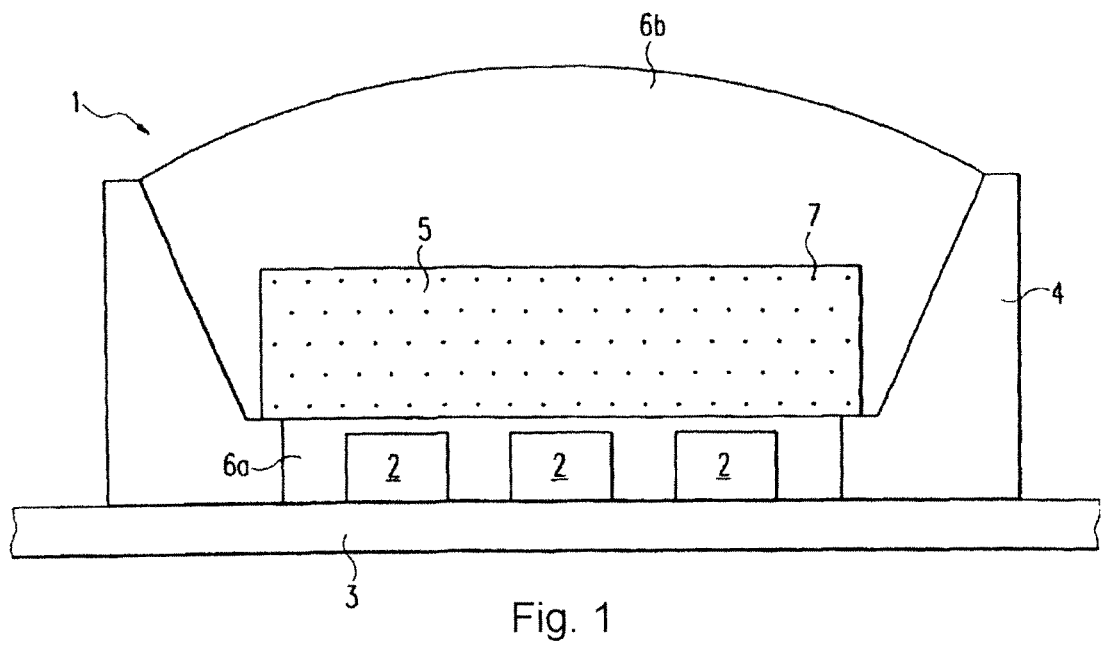
FIG. 1 shows a schematic illustration of the LED module according to the invention in accordance with a preferred embodiment.

FIG. 1 shows a first preferred embodiment of the LED module 1 according to the invention. In this case, one or more LED chips 2 have been applied to a substrate 3. The LED chips can be fastened on the substrate 3 in the face-up or face-down position. A reflector 4, which preferably has a reflective surface, is fitted likewise on the substrate 3 and around the LED chips 2. A color conversion film 5 is arranged within the reflector 4. Said color conversion film 5 firstly serves the purpose of protecting the LED chips 2 and secondly this film 5 contains the phosphor mixture 7 according to the invention. The film 5 is preferably prefabricated. Optionally, a transparent casting compound 6a, which preferably comprises silicone, can be arranged between the film 5 and the LED chips 2. The casting compound 6a is preferably applied to the LED chips with the aid of a dispensing operation. Preferably, a transparent casting compound 6b, which preferably comprises silicone, is likewise arranged above the film 5.

DETAILED DESCRIPTION

A portion of the blue light, which is emitted by the LED chip 2, is converted by the phosphor mixture 7 into the colors green, yellow and red as it passes through the film 5. As a result of the additive color mixing, accordingly, a white color impression of the light emitted by the film 5 is produced. It is also possible to apply the phosphor mixture 7 to the reflector 4 without any film 5 being necessary.

Figure 2:
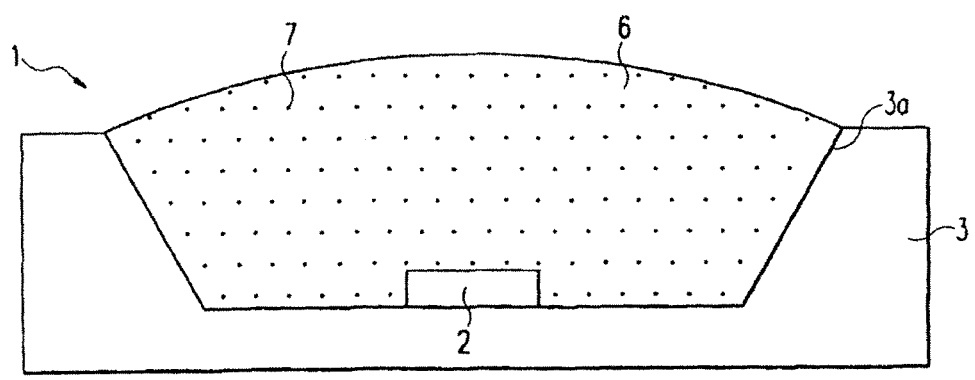
FIG. 2 shows a schematic illustration of the LED module according to the invention in accordance with a further preferred embodiment.

FIG. 2 shows a further preferred embodiment of the present invention. In this case, the substrate 3 has a cavity 3a, in which at least one LED chip 2 is located. The surface of the cavity 3a is preferably coated with a reflective material. The cavity 3a is at least partially filled with optically transparent casting compound 6, which forms a layer above the LED chip 2. Curable synthetic resin, for example, can be used for this purpose. Preferably, the casting compound 6 contains the phosphor mixture 7 according to the invention. There is preferably no gas inclusion between the layer 6 and the LED chip 2. The layer 6 is preferably introduced into the cavity 3a with the aid of a dispensing operation. Optionally, a further layer (not illustrated) can be arranged between the layer 6 and the LED chip 2, and this layer preferably has a transparent casting compound. The casting compound is preferably introduced into the cavity 3a with the aid of a dispensing operation.

Figure 3A:
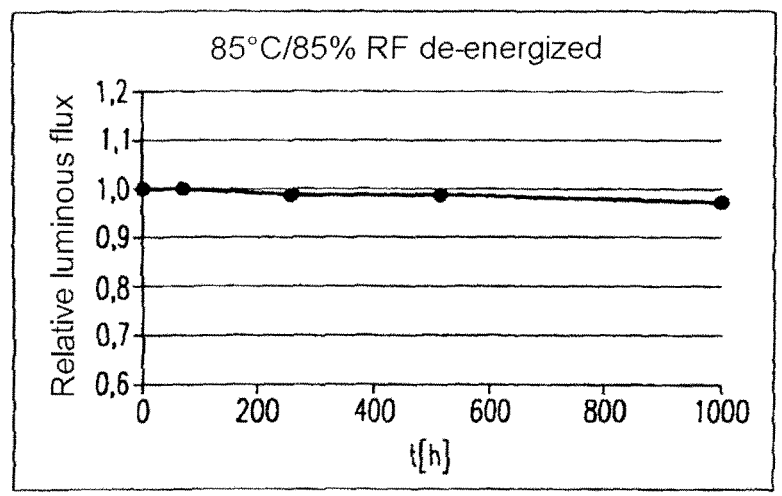
FIGS. 3a and 3b show the luminous flux of an emitted light as a function of the test time of an LED module according to the invention in the de-energized and energized state at 85° C. and 85% relative humidity.
Figure 3B:
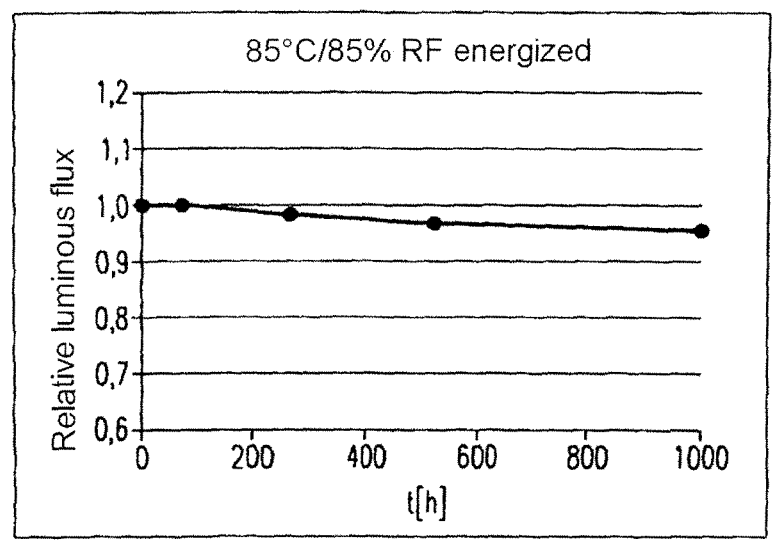

FIGS. 3a and 3b show the luminous flux of an emitted light as a function of the test time of an LED module according to the invention in the de-energized and energized state at 85° C. and 85% relative humidity. The maximum test time is 1000 hours. In the de-energized state, there is no current present at the LED module. In the energized state, the maximum operating current permissible for the product is present at the LED module. This is typically between 200 and 1000 mA for products in the medium and high power range.

As is shown in the two graphs, the three-band phosphor system according to the invention has a high degree of stability of the luminous flux even at a high relative humidity of 85%. The stability shown can be proved both for the de-energized state and for the energized state. The deviation of the luminous flux at a maximum test duration of 1000 hours is in this case a maximum of 5%.

Figure 4A:
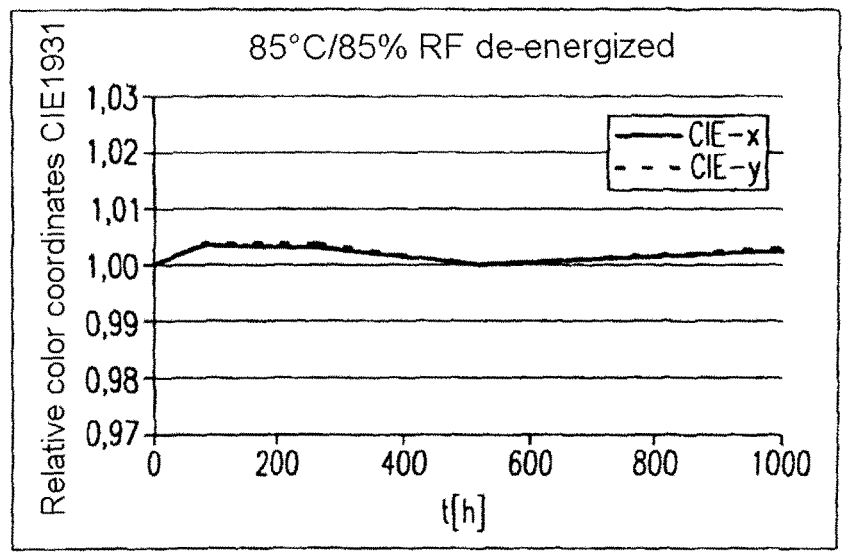
FIGS. 4a and 4b show the relative chromaticity coordinates of an emitted light as a function of the test time of an LED module according to the invention in the de-energized and energized state at 85° C. and 85% relative humidity.
Figure 4B:
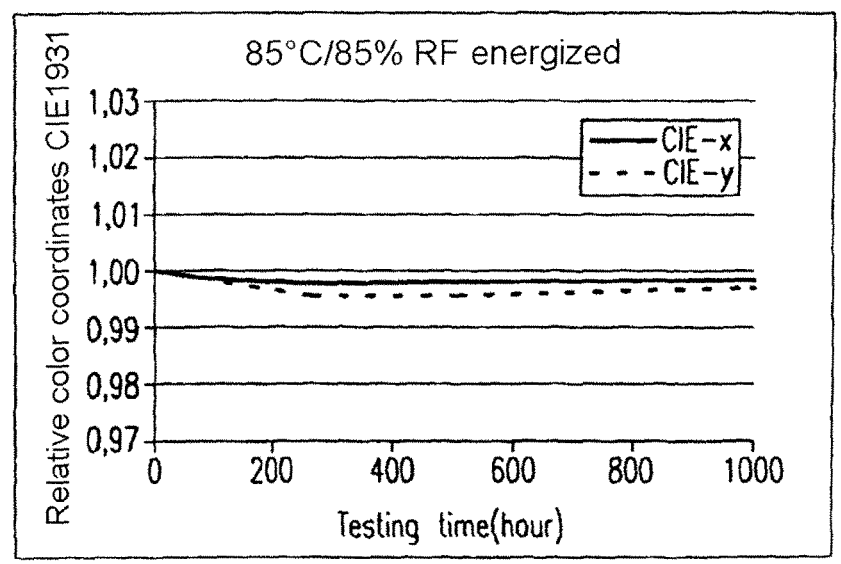

FIGS. 4a and 4b show the relative chromaticity coordinates of an emitted light as a function of the test time of an LED module according to the invention in the de-energized and energized state at 85° C. and 85% relative humidity. The maximum test time is 1000 hours in this case, too. The de-energized and energized state corresponds to the states described in FIGS. 3a and 3b. The color locus is given by the x and y coordinates (CIE-x, CIE-y) in the CIE chromaticity diagram.

It can clearly be seen from the graphs in FIGS. 4a and 4b that the three-band phosphor system according to the invention also has high stability with respect to the change in the color locus in the test time. The change in the corresponding x and y coordinates is at most ±0.05%.

In the graphs in FIGS. 3a, 3b and 4a, 4b, the fact that the results shown not only relate to the three-band phosphor system according to the invention but also to the entire LED module (entire package) should be taken into consideration. The stability of the three-band phosphor system can accordingly be assumed to be better than or at least as good as illustrated in the figures.

Figure 5:
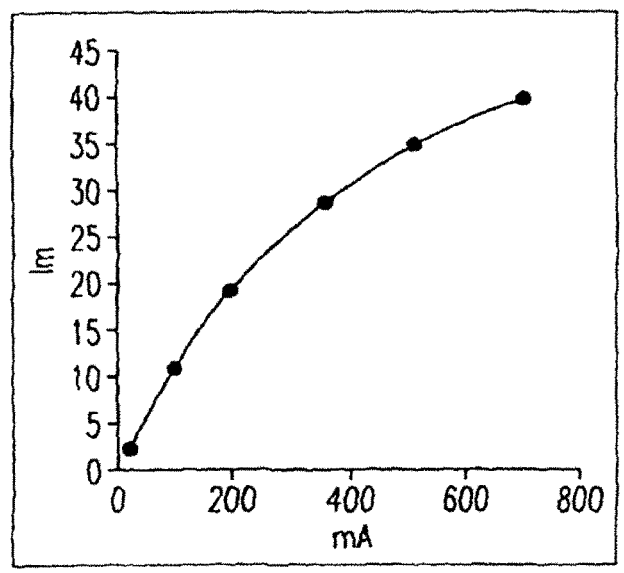
FIG. 5 shows the change in the luminous flux as a function of the operating current of an LED module according to the invention.

FIG. 5 shows the change in the luminous flux as a function of the operating current of an LED module according to the invention. As is shown in the graph, the luminous flux increases considerably as the operating current increases up to 700 mA.

In contrast to the known phosphor systems, for example a mixture of BOSE green and BOSE orange, the profile of the graph therefore does not have a maximum value to which the luminous flux increases in order then to drop back again as the current intensity further increases as a result of quenching and/or temperature effects. The phosphor system according to the invention therefore has a high degree of stability even at high operating currents without there being a drop in the luminous flux.

It should be noted that the maximum current at which the phosphor mixture is still stable is strongly dependent, inter alia, on the geometry and the thermal management of the LED module. Stable operation of the phosphor mixture according to the invention at 1000 mA is possible in the case of a large cavity and therefore a low phosphor concentration at 3000 K and RA8=90.

Figure 6A:
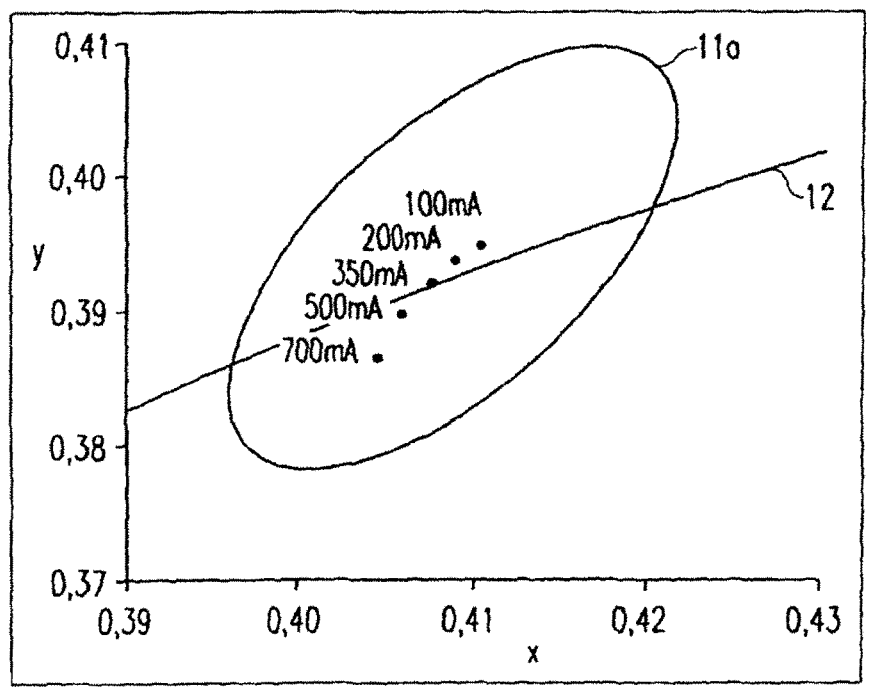
FIG. 6a shows the change in the relative chromaticity coordinates of the emitted light as a function of the operating current in the range of 100-700 mA.
Figure 6B:
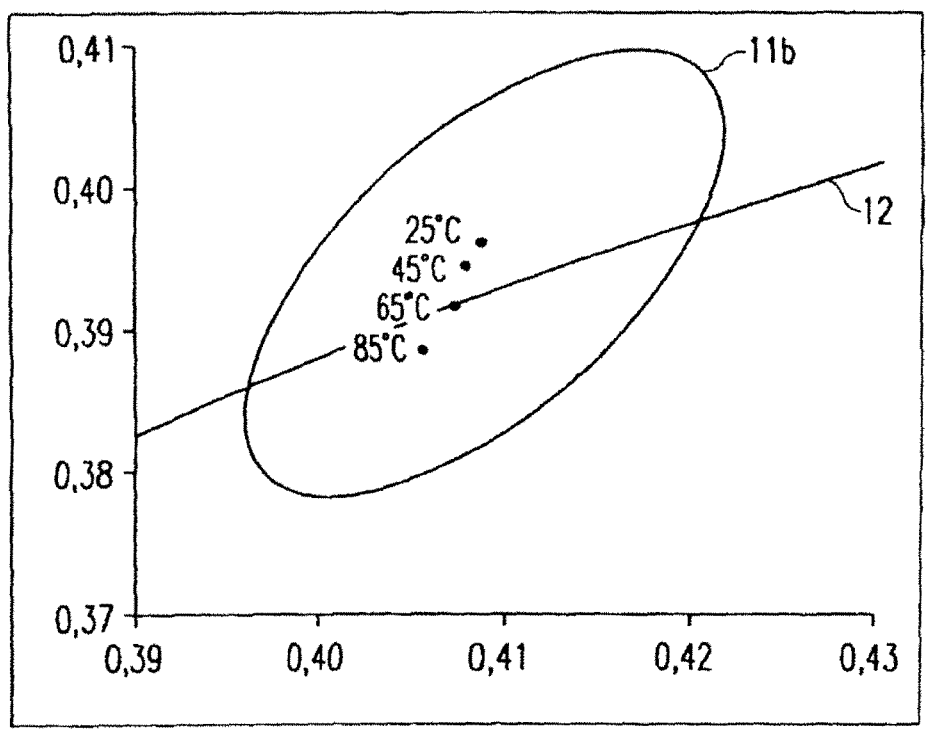
FIG. 6b shows the change in the relative chromaticity coordinates of the emitted light as a function of the ambient temperature in the range of 25-85° C.

FIGS. 6a and 6b show the stability of the phosphor system in the event of changes in the operating current (100-700 mA) or in the ambient temperature (25-85° C.). The x and y coordinates indicate the color locus on a CIE chromaticity diagram. The characteristic 12 shows the Planckian locus. The illustrated tolerance windows 11a and 11b are the MacAdam6 ellipses.

The difference between the color loci at 25° C. and 85° C. merely corresponds to approximately one fifth of the longitudinal axis of the MacAdam ellipse. The difference between the color loci at 100 mA and 700 mA corresponds to less than 30% of the longitudinal axis of the ellipse.

The weakness known from the prior art that stability problems in the phosphor systems often occur at high current intensities at low color temperatures (warm white) and high color rendering values is not shown in FIGS. 6a and 6b. The phosphor system according to the invention, on the other hand, is characterized by excellent stability in terms of the color locus shift as a function of the ambient temperature and the current intensity.

For finely setting the color rendering value and for optimizing the phosphor component ratio of a three-band phosphor system of an LED module, two different methods can be used.

Figure 7:
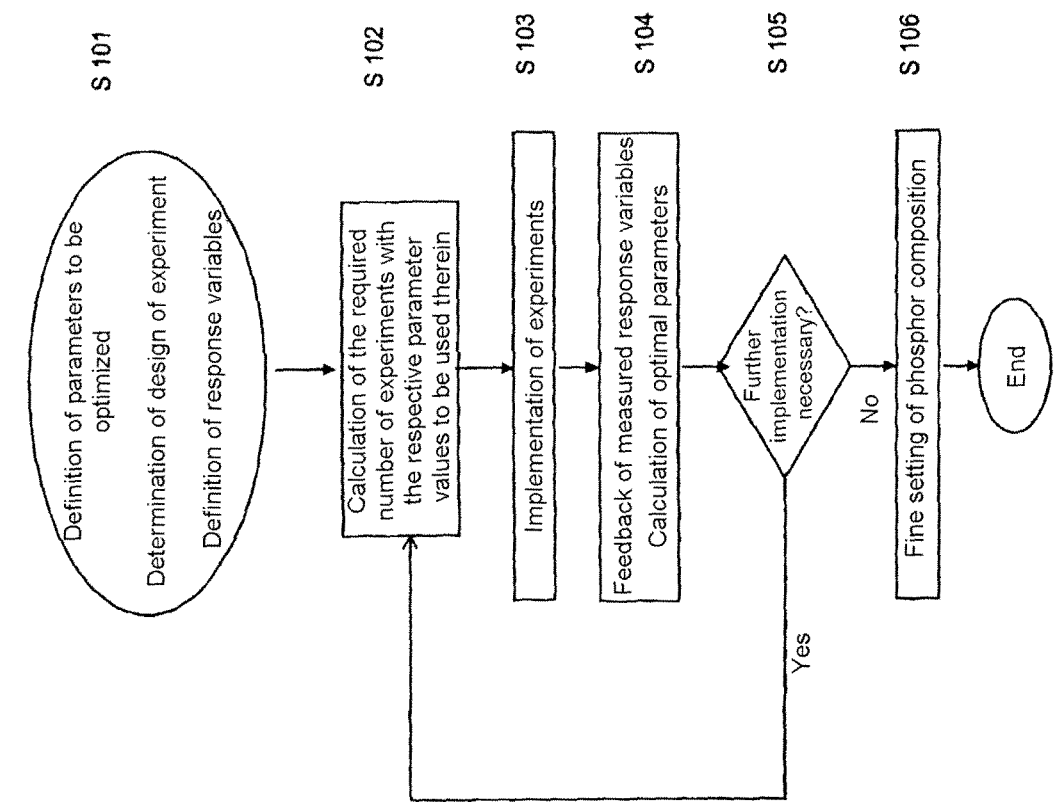
FIG. 7 shows a first exemplary method for finely setting the color rendering value and for optimizing the phosphor component ratio of a three-band phosphor system of an LED module.

If phosphor compositions with defined color rendering values at a plurality of color temperatures are intended to be set, a so-called design of experiments, DOE for short below, can be implemented. This is used in the first method, which is illustrated in FIG. 7.

For this purpose, a corresponding computer program is used which can be used to implement a DOE. The parameters which are intended to be optimized, i.e. the concentrations of the three phosphors c(A), c(B), c(C), for example, are defined for the first time in step S101. Furthermore, the DOE which is intended to be used, for example a factorial DOE, is determined. In addition, so-called "response" variables which are intended to be maximized or minimized, for example luminous flux and color rendering value, are fixed.

It is naturally not possible to maximize luminous flux and color rendering value independently of one another, especially since the color temperature and the dominant wavelength of the chip likewise play a role as further variables.

The computer program thereupon calculates, in S102, a certain number of experiments to be implemented and the variables of the individual parameters in the experiments.

Once the experiment has been performed in S103, the operator in S104 inputs the values of the response variables obtained. The computer program thereupon calculates, in S105, values of c(A), c(B) and c(C), which are optimum for this first cycle.

Normally, a further operation in S105 and final fine setting of the phosphor composition in S106 are necessary in order to achieve optimum results.

Figure 8:
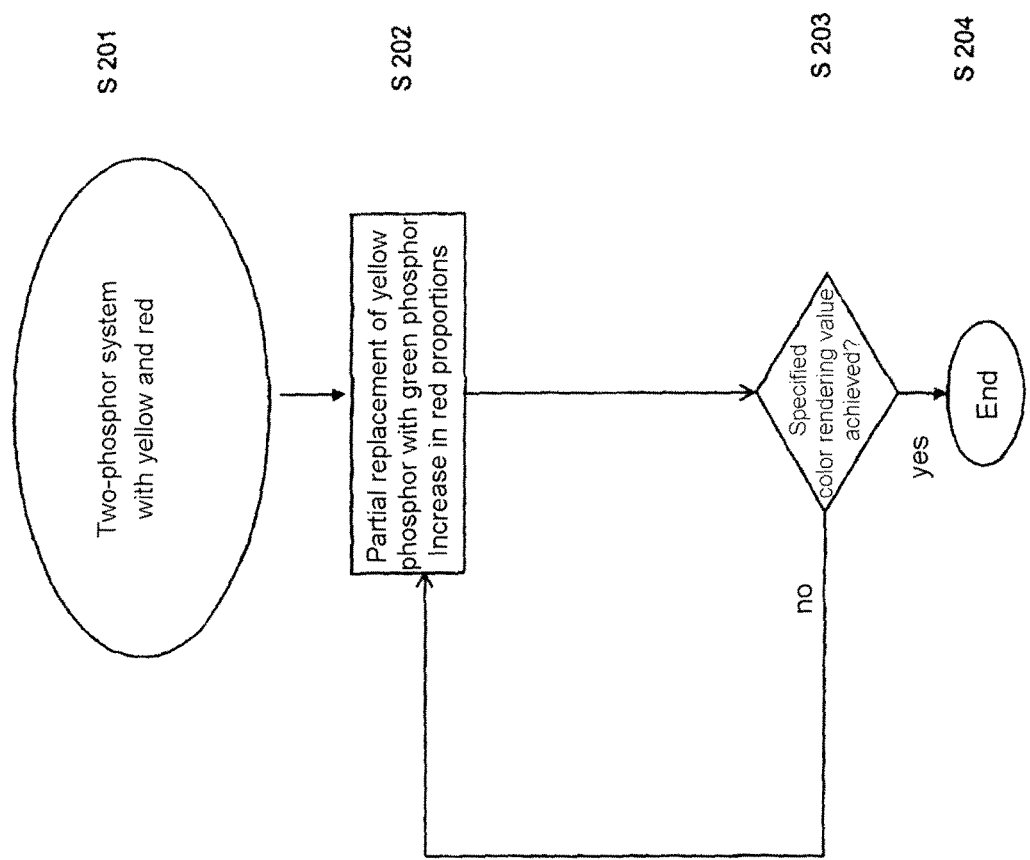
FIG. 8 shows a second exemplary method for finely setting the color rendering value and for optimizing the phosphor component ratio of a three-band phosphor system of an LED module.

If only one or two color temperatures are required, on the other hand, an alternative method can be used to achieve more quickly the object illustrated in FIG. 8. In this case, the setting is performed without DOE by means of manual iteration.

In this case, it is first of all assumed in step S201 that there is a two-phosphor system, for example yellow and red. This has a color rendering value which is too low.

Then, in S202, parts of the yellow phosphor are replaced by green phosphor stepwise by iteration by means of the loops in S203. At the same time, the red proportions are increased in order to keep the color locus constant.

The method is then brought to an end if the specified color rendering value has been reached.

In this case, too, it is necessary to take account of the fact that the phosphor composition also needs to be adapted in the event of a change in chip wavelength.

The invention claimed is:

1. A light-emitting diode (LED) module, having at least one blue LED and a color conversion layer applied thereto, which module emits a mixed light from the spectrum of light of the LED and the converted spectrum of the color conversion layer, wherein
   the color conversion layer has at least three different phosphors, which convert the light of the blue LED at least partially into red, green, and yellow or yellow-green light,
   the phosphor for conversion into red light is a doped nitride compound,
   the phosphor for conversion into green light is a europium-doped alkaline earth orthosilicate,
   the percentage proportion of alkaline earth orthosilicate in the color conversion layer is from 10 percent to 50 percent,
   the phosphor for conversion into yellow or yellow-green light is a doped yttrium aluminum garnet (YAG) phosphor,
   wherein the percentage proportion of phosphor based on nitride in the color conversion layer is from 10 percent to 30 percent, and
   wherein the percentage proportion of phosphor based on YAG in the color conversion layer is from 20 percent to 41 percent.

2. The LED module as claimed in claim 1, wherein the phosphors for conversion into red, green, and yellow or yellow-green light are mixed in a predefined ratio in order to achieve a specific color rendering value of the LED module.

3. The LED module as claimed in claim 2, wherein the ratio of the phosphors is selected such that the greatest possible luminous efficacy of the LED module can be achieved with a predefined color rendering value.

4. The LED module as claimed in claim 1, wherein the LED module has a color rendering value of between 75 and 95.

5. The LED module as claimed in claim 4, wherein the color rendering value of the LED module can be set freely to be in the region of 75 at 5700 K and approximately 100 at 4000 K.

6. The LED module as claimed in claim 4, wherein the setting of the color rendering value is made possible by adapting the ratio of the phosphors in the color conversion layer.

7. The LED module as claimed in claim 1, wherein the green phosphor has a main wavelength of from 520 nm to 530 nm.

8. The LED module as claimed in claim 1, wherein the red phosphor has a main wavelength of from 630 nm to 650 nm.

9. The LED module as claimed in claim 1, wherein the yellow or yellow-green phosphor has a main wavelength of 555 nm to 570 nm.

10. The LED module as claimed in one of the preceding claims, wherein the europium-doped alkaline earth orthosilicate phosphor is a europium-doped barium orthosilicate (BOSE).

11. The LED module as claimed in claim 1, wherein the phosphor for conversion into red light is a nitridosilicate.

12. The LED module as claimed in claim 5, wherein the setting of the color rendering value is made possible by adapting the ratio of the phosphors in the color conversion layer.

* * * * *